(12) United States Patent
Warriner et al.

(10) Patent No.: US 9,858,134 B2
(45) Date of Patent: Jan. 2, 2018

(54) LOW LATENCY DIGITAL CLOCK FAULT DETECTOR

(71) Applicant: Microsemi Semiconductor ULC, Kanata (CA)

(72) Inventors: Mark A Warriner, Ottawa (CA); Mark L Thrower, Carrollton, TX (US)

(73) Assignee: Microsemi Semiconductor ULC, Kanata, Ontario (CA)

( * ) Notice: Subject to any disclaimer, the term of this patent is extended or adjusted under 35 U.S.C. 154(b) by 136 days.

(21) Appl. No.: 15/064,615

(22) Filed: Mar. 9, 2016

(65) Prior Publication Data

US 2016/0299806 A1 Oct. 13, 2016

Related U.S. Application Data

(60) Provisional application No. 62/144,350, filed on Apr. 8, 2015.

(51) Int. Cl.
*G06F 11/07* (2006.01)
*G01R 31/00* (2006.01)
*G06F 1/04* (2006.01)

(52) U.S. Cl.
CPC .......... *G06F 11/0757* (2013.01); *G01R 31/00* (2013.01); *G06F 1/04* (2013.01); *G06F 11/0706* (2013.01)

(58) Field of Classification Search
CPC ............. G06F 11/0757; G06F 11/0772; G06F 11/1604; G06F 11/1679
USPC ........................................................ 714/55
See application file for complete search history.

(56) References Cited

U.S. PATENT DOCUMENTS

| | | | | |
|---|---|---|---|---|
| 4,137,565 A | * | 1/1979 | Mager | G05B 19/054 710/22 |
| 5,721,501 A | * | 2/1998 | Toyoda | H03K 5/00006 327/116 |
| 5,857,005 A | * | 1/1999 | Buckenmaier | G06F 5/06 326/93 |
| 2003/0060964 A1 | * | 3/2003 | Ozeki | F02D 41/22 701/114 |
| 2005/0193293 A1 | * | 9/2005 | Shikata | G11C 29/028 714/718 |
| 2006/0149983 A1 | * | 7/2006 | Kondou | G06F 1/04 713/321 |
| 2009/0147610 A1 | * | 6/2009 | Shikata | G06F 1/08 365/226 |
| 2010/0156490 A1 | * | 6/2010 | Hong | H03K 5/1534 327/161 |
| 2012/0092052 A1 | * | 4/2012 | Matsuda | G01R 25/08 327/158 |

(Continued)

FOREIGN PATENT DOCUMENTS

JP 2004326405 A * 11/2004

*Primary Examiner* — Chae Ko
(74) *Attorney, Agent, or Firm* — Simon Kahn

(57) ABSTRACT

A low latency digital clock fault detector has an edge detector including a delay line generating pulses on edges o an incoming clock signal of a width determined by the length of said delay line. A watchdog timer with flip-flops in a pipeline configuration has a first input held at a static logic level, a second input receiving a reference clock, and a third reset input. The watchdog is being responsive to the pulses to maintain a stable output in the presence of said pulses and generate a fault indication in the absence of the pulses.

20 Claims, 2 Drawing Sheets

(56) References Cited

U.S. PATENT DOCUMENTS

2013/0257499 A1* 10/2013 Wang .................. H03K 5/1565
327/175
2014/0240020 A1* 8/2014 Kris ....................... H02M 1/08
327/241

* cited by examiner

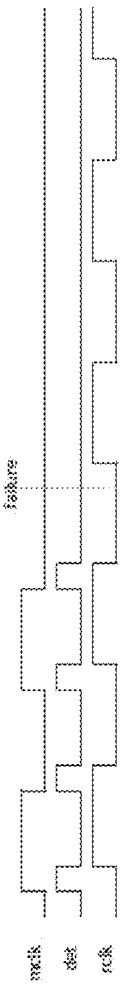
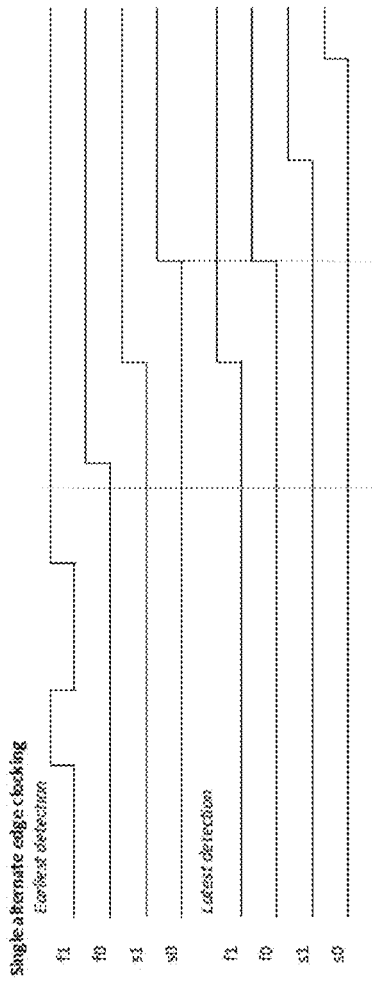
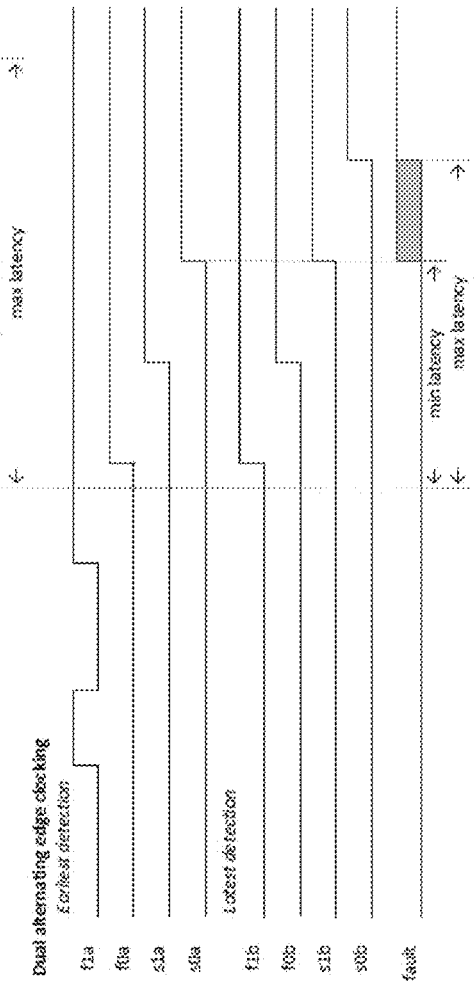

LOW LATENCY DIGITAL CLOCK FAULT DETECTOR

CROSS REFERENCE TO RELATED APPLICATION

This application claims the benefit under 35 USC 119(e) of U.S. provisional application No. 62/144,350, filed Apr. 8, 2015, the contents of which are herein incorporated by reference.

FIELD OF THE INVENTION

This invention relates to the field of precision timing, and more particularly to a low latency digital clock fault detector, for example for use in digital communications.

BACKGROUND OF THE INVENTION

Most integrated circuits (ICs) require one or more periodic toggling signals, known as clocks, to function. In the design of reliable, available, and serviceable (RAS) systems, clock fault detection is important for assessing system health and for triggering automatic corrective action, such as selecting a redundant clock source or transferring control to backup equipment.

Many circuits have been used for clock fault detection. One prior art example uses a delay line and flip-flop as shown in FIG. 1. This design, which comprises a delay line 10, multiplexer 12, pair of flip-flops 14a, 14b, inverter 16, and OR gate 18, has a low latency and does not require another clock. However, it suffers from several disadvantages. The delay line position selected by the multiplexer must be tuned for the clock frequency, which may not be known a priori. Variations in the delay line over process and temperature may require a calibration scheme. If a range of frequencies is required, the delay line requires a large number of taps. A multi-tap delay line primitive may not be available in all digital design libraries, and building a delay line from individual buffer or delay cells can make timing difficult to control.

SUMMARY OF THE INVENTION

Embodiments of the invention provide a digital circuit that continuously monitors activity on a clock using another known working reference clock, and reports when the monitored clock fails by asserting a status signal. The digital circuit may operate with a low latency, allowing any corrective action to be taken more quickly in the event of a fault.

According to the present invention there is provided a low latency digital clock fault detector, comprising an edge detector including a delay line for generating pulses on edges of an incoming clock signal, the width of said pulses being determined by the length of said delay line; a watchdog timer comprising flip-flops in a pipeline configuration, said watchdog timer having a first input held at a static logic level, a second input receiving a reference clock, and a third reset input, said watchdog timer being responsive to said pulses to maintain a stable output in the presence of said pulses and generate a fault indication in the absence of said pulses.

A digital circuit in accordance with the invention offers various advantages. It can detect a clock failure with very low latency and low latency variation. One embodiment has an efficient hardware implementation, and is built entirely from standard digital logic primitives. The nominal frequencies of the monitored clock and reference clock may differ by a large amount, which is tunable by adjusting the circuit. Because the circuit triggers a fault based on the ratio between the monitored clock and reference clock, it can accept a wide range of input frequencies without any configuration. It also does not require a high frequency monitoring clock.

Because of these advantages, the digital circuit is particularly well-suited for cross-monitoring in master clock redundancy applications with multiple clock sources of varying but equal nominal frequencies.

In accordance with another aspect of the invention there is provided a method of detecting faults in a clock signal, comprising generating pulses of predetermined width on edges of an incoming clock signal; and monitoring said pulses with a watchdog timer that maintains a stable output in the presence of said pulses and generates a fault indication in the absence of said pulses.

BRIEF DESCRIPTION OF THE DRAWINGS

This invention will now be described in more detail, by way of example only, with reference to the accompanying drawings, in which:

FIGS. 4a to 4e are timing diagram for the described clock fault detectors.

DETAILED DESCRIPTION OF PREFERRED EMBODIMENTS

Figure 1:
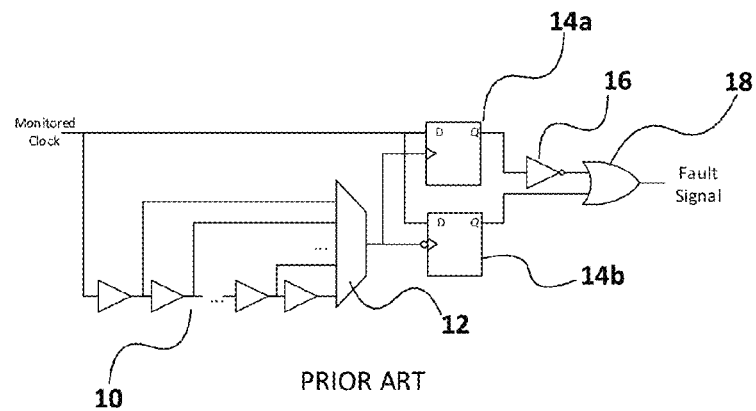
FIG. 1 is a prior art digital fault detector based on delay line and flip flops.
Figure 2:
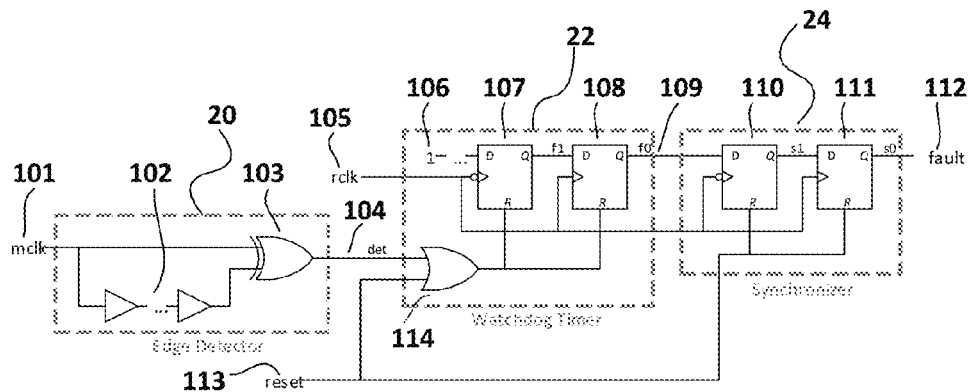
FIG. 2 is a schematic diagram of a clock fault detector with single alternating edge clocking in accordance with one embodiment of the invention.

A digital fault detector with a single alternate edge clocking scheme in accordance with one embodiment of the invention is shown in FIG. 2.

An input clock to be monitored mclk 101 is first fed to an edge detector circuit 20 comprising a delay line 102 and an XOR gate 103 in a feed-forward configuration. An XNOR gate may be used in place of the XOR gate, if the resulting polarity is more convenient for the downstream logic.

The edge detector circuit 20 acts as a clock doubler. Every rising or falling edge on mclk 101 generates a pulse on the edge detector output 104. The width of this pulse is determined by the latency of the delay line 102, which should be constrained to be greater than the asynchronous reset time of downstream flip-flops 107, 108, but less than the smallest of the expected times that the mclk is high or low. Typically, a fixed structure can be found e.g. a few buffers that will satisfy both of these conditions over all operating conditions. If desired however, the delay line can be made configurable with multiple taps and a multiplexer.

The edge detector output 104 is used as an asynchronous reset for a watchdog timer 22. A watchdog timer is an electronic timer that is used to detect and recover from malfunctions. During normal operation, the monitored circuit regularly restarts the watchdog timer to prevent it from timing out. If, due to a hardware fault or program error, the monitored circuit fails to restart the watchdog timer, the timer will elapse and generate a timeout signal. The timeout signal can be used to initiate corrective action or actions.

In this case the watchdog timer 22 comprises two or more alternating edge flip-flops 107, 108 in a pipeline configuration with a static logic 1 input 107 and clocked by a reference clock signal rclk 105. As long as mclk is running, pulses are produced by the edge detector 20, the flip-flops 107, 108 with outputs f1, f0 will be repeatedly reset, and the output 109 of the watchdog timer 22 will remain at logic 0. If mclk fails, the pulses will stop, and a logic 1 will propagate to the watchdog timer output 109, reporting a fault to the synchronizer 24. This is the point of no return. Once the logic level 1 has propagated to the synchronizer 24, the fault detector will output a logic value of 1 on the fault line even if the monitored clock mclk suddenly recovers at this point.

The length of the pipeline can be adjusted based on the relative frequency between mclk and rclk and the tolerance for declaring a fault. If rclk is much faster than mclk, more than two flip-flops will be required in the chain. If desired, the pipeline length can be made configurable using a multiplexer.

The output 109 of the watchdog timer 22 is fed to a synchronizer 24 comprising two back-to-back alternating edge flip-flops 110, 111. The output of flip-flop 110 is shown as s1. The synchronizer 24 ensures synchronous timing relationship to any downstream digital logic running on the same clock. It also acts as a metastability trap to reduce the probability that metastability effects will propagate into downstream logic and additionally enforces a minimum pulse width of one clock period on its output. If desired, the synchronizer could be clocked by a different internal clock. If the downstream logic is asynchronous and uses a latch structure tolerant of a potentially metastable signal, the synchronizer could be foregone completely, further reducing fault detection latency.

A reset input 113 is provided to ensure the initial condition of the circuit does not report a fault. The reset also serves to disqualify a fault in the case that rclk itself is known to have failed as detected by an equivalent circuit, thus preventing a deadlock situation. The reset input 113 is combined with the edge detector output 104 using an OR gate 114 to asynchronously reset the flip-flops in the watchdog timer 22. The flip-flops 110, 111 in the synchronizer 24 use the reset input 113 directly.

Figure 3:
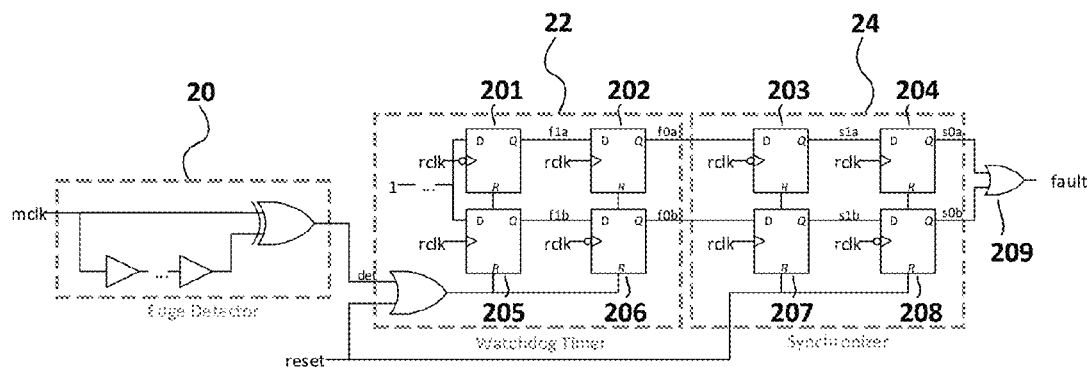
FIG. 3 is a schematic diagram of a clock fault detector with dual alternating edge clocking in accordance with another embodiment of the invention.

An alternative embodiment shown in FIG. 3 provides a further enhancement to the circuit presented in FIG. 2. The single pipeline of alternating edge flip-flops from in the watchdog timer 22 and synchronizer 24 of FIG. 2 have been replaced with two complementary pairs of alternating edge flip-flops 201, 204, and 205, forming a dual alternating edge clocking scheme. The output of the two pipelines are combined with an OR gate (209). Alternatively, a single pipeline could be built from true dual edge clocked flip-flops, if those are available. Clocking on both edges serves to reduce the latency of the clock fault detector, at the cost of additional hardware complexity.

The operation of the fault detectors is illustrated in the timing diagrams of FIGS. 4a, to 4e. FIG. 4a shows the external signals mclk and rclk and the edge signal det generated by the edge detector 20. It is assumed that the monitored clock fails at the point in time marked by the vertical line failure.

In the case of single alternate edge clocking as shown in FIG. 2 and FIGS. 4b, 4c, when the monitored clock mclk stops running and is stuck low at the failure point, the reference clock rclk is aligned such that the de-assertion of edge detection pulse det arrives within the reset removal time of the first-flip flop in the watchdog timer. At this point, it is indeterminate whether the first flop-flip 107 (output f1) will clock in the logic 1 or will remain in reset. The levels of the signals f1, f0, s1, s0 are shown in FIGS. 4b, 4c for the earliest and latest possible detection scenarios.

With dual alternative edge clocking as shown in FIG. 3 and FIGS. 4d, 3e, both pipelines sample on opposite edges, and thus the latest detection case is only one half clock cycle later than the earliest detection.

In both cases, the greyed areas represent the period during which the fault detector can output a fault. The minimum latency is represented by the start of this period, and the maximum latency by the end of this period.

Fault detection latency is measured as the time between the first missing clock edge and the time where the synchronized fault signal is asserted and shown for the earliest and latest possible point of detection. Compared with single alternating edge clocking as implemented in the embodiment of FIG. 2, dual alternating edge clocking as implemented in the embodiment of FIG. 3 has a lower average latency, lower maximum latency, and lower latency variation. Latency variation is particularly important in applications where the outage resulting from a clock failure needs to be precisely compensated for. The minimum latency, and thus safety margin for declaring false alarms, remains the same for both schemes.

It will be understood that the flip-flops described herein are D-type flip-flops.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor DSP hardware, network processor, application specific integrated circuit ASIC, field programmable gate array FPGA, read only memory ROM for storing software, random access memory RAM, and non-volatile storage. Other hardware, conventional and/or custom, may also be included. The functional blocks or modules illustrated herein may in practice be implemented in hardware or software running on a suitable processor. It will also be appreciated that the expression "circuit" covers both software and hardware implementations, for example making use of primitives.

The invention claimed is:

1. A low latency digital clock fault detector, comprising:
   an edge detector comprising a delay line for generating pulses on edges of an incoming clock signal, the width of said pulses being determined by the length of said delay line;
   a watchdog timer comprising flip-flops in a pipeline configuration, said watchdog timer having a first input held at a static logic level, a second input receiving a reference clock, said watchdog timer being responsive to said pulses to maintain a stable output in the presence of said pulses and generate a fault indication in the absence of said pulses.

2. A low latency digital clock fault detector as claimed in claim 1, wherein said watchdog timer comprises a plurality of D-type flip-flops arranged in said pipeline configuration, a D input of the first flop-flop receiving said static logic level, and a Q output of each flip-flop other than the final flip-flop being coupled to a D input of the subsequent flip-flop, with a Q output of the final flip-flop providing said fault indication output of said watchdog timer.

3. A low latency digital clock fault detector as claimed in claim 1, further comprising a synchronizer downstream of said watchdog timer and receiving said fault indication, said synchronizer comprising first and second flip-flops in back-to-back configuration to reduce propagation of metastability effects and enforce a minimum pulse width at an output thereof.

4. A low latency digital clock fault detector as claimed in claim 1, further comprising a reset input for receiving a reset signal and a logic gate for coupling said reset signal to said flip-flops of said watchdog timer.

5. A low latency digital clock fault detector as claimed in claim 1, wherein said watchdog timer comprises successive first and second complementary pairs of flip-flops forming parallel pipelines.

6. A low latency digital clock fault detector as claimed in claim 5, wherein said flip-flops are D-type flip-flops, and Q outputs of said flip-flops of said first pair are coupled to D inputs of said flip-flops of said second pair.

7. A low latency digital clock fault detector as claimed in claim 2, wherein said flip-flops are dual edge flip-flops.

8. A low latency digital clock fault detector as claimed claim 5, further comprising a synchronizer downstream of said watchdog timer and receiving said fault indication, said synchronizer comprising first and second pairs of flip-flops in back-to-back configuration forming parallel pipelines coupled to said pipelines of said watchdog timer.

9. A low latency digital clock fault detector as claimed in claim 8, wherein outputs of said pipeleines in said synchronizer are fed to an OR gate to provide said fault indication.

10. A low latency digital clock fault detector as claimed in claim 1, wherein said flip-flops are responsive to a reset signal to allow said flip-flops to be asynchronously reset.

11. A low latency digital clock fault detector as claimed in claim 1, wherein said edge detector comprises a delay line and a logic gate selected from the group consisting of an XOR gate and an XNOR gate arranged in a feed-forward configuration.

12. A low latency digital clock fault detector as claimed in claim 11, wherein the delay line is configurable with multiple taps.

13. A method of detecting faults in a clock signal, comprising:
generating pulses of predetermined width on edges of an incoming clock signal; and
monitoring said pulses with a watchdog timer having a first input held at a static logic level and a second input receiving a reference clock, said watchdog timer maintaining a stable output in the presence of said pulses and generating a fault indication in the absence of said pulses.

14. A method as claimed in claim 13, further comprising passing an output of said watchdog timer through a synchronizer to reduce propagation of metastability effects.

15. A method as claimed in claim 13, wherein said pulses of predetermined width are generated by a delay line.

16. A method as claimed in claim 15, wherein said delay line is configurable.

17. A method as claimed in claim 13, wherein said watchdog timer comprises a plurality of D-type flip-flops arranged in said pipeline configuration, a D input of the first flop-flop receiving said static logic level, and a Q output of each flip-flop other than the final flip-flop being coupled to a D input of the subsequent flip-flop, with a Q output of the final flip-flop providing said fault indication output of said watchdog timer.

18. A method as claimed in claim 14, wherein said watchdog timer comprises successive first and second complementary pairs of flip-flops arranged to form parallel pipelines, and the reference clock is applied separately to each said pipeline.

19. A method as claimed claim 18, wherein said synchronizer comprise first and second pairs of flip-flops in back-to-back configuration forming parallel pipelines coupled to said pipelines of said watchdog timer.

20. A method as claimed in claim 19, wherein outputs of the pipleines of the synchronizer are passed through an OR gate to provide the fault indication.

* * * * *